United States Patent [19]

Lawson

[11] 3,954,524

[45] May 4, 1976

[54] SELF-ALIGNING PHOTORESIST PROCESS FOR SELECTIVELY OPENING TOPS OF MESAS IN MESA-DIODE-ARRAY STRUCTURES

[75] Inventor: James R. Lawson, Tempe, Ariz.

[73] Assignee: Texas Instruments Incorporated, Dallas, Tex.

[22] Filed: July 26, 1974

[21] Appl. No.: 492,090

[52] U.S. Cl................................. 148/187; 156/8; 357/49
[51] Int. Cl.² .................................... H01L 21/306
[58] Field of Search...................... 148/187; 357/49

[56] References Cited
UNITED STATES PATENTS 3,737,702  6/1973  Kooi et al. ................... 148/187 UX Primary Examiner—L. Dewayne Rutledge
Assistant Examiner—J. M. Davis
Attorney, Agent, or Firm—Harold Levine; James T. Comfort; Gary C. Honeycutt

[57] ABSTRACT

This disclosure relates to a self-aligned photoresist process for use in removing silicon dioxide from the tops of silicon mesas or other semiconductor mesa structures. The specific application is in the production of an array of mesa P-N diodes on a semiconductor slice which have oxide passivation in the valleys between the mesas. In the production of such diodes, an early step in the overall processing of the devices is to thermally oxidize the entire mesa structure prior to diffusing the P-N junction therein. In order to prepare the slice for the junction diffusion, it is necessary to first remove the thermal oxide from only the tops of the mesas leaving the oxide in the valleys for the purpose of isolation. This oxide removal is provided herein without complicated alignment steps by depositing a photoresist over the oxide passivation layer in such a way that the photoresist thickness over the mesas is thinner than it is in the valleys between the mesas. The photoresist is then exposed to light for a predetermined amount of time so that the photoresist is completely exposed in the regions over the mesas but only exposed inwardly for a predetermined distance in the valleys. In this way, when the photoresist is removed, it is removed entirely from the mesa regions but only partially within the valleys, thereby leaving a photoresist layer in the valleys. The oxide can now be removed by normal etching techniques from the mesas with the oxide remaining in the valleys. Diodes can then be formed in the mesa regions by normal processing techniques.

2 Claims, 4 Drawing Figures

SELF-ALIGNING PHOTORESIST PROCESS FOR SELECTIVELY OPENING TOPS OF MESAS IN MESA-DIODE-ARRAY STRUCTURES

This invention relates to a self-aligning photoresist process for selectively opening tops of mesas in mesa-diode-array structures and, more specifically, to a method of removing oxide only from the mesas of a semiconductor structure without the requirement of complex aligning techniques.

In the production of arrays of mesa P-N diodes on a semiconductor slice, such as silicon, which have oxide passivation in the valleys between the mesas, an early step in the overall processing procedure of the devices is to thermally oxidize the entire mesa structure prior to diffusing the P-N junctions into the mesas to form the diodes therein. In order to prepare the slice for this junction diffusion, it is necessary to remove the thermal oxide only from the tops of the mesas, leaving the oxide in the valleys to effect proper isolation between diodes. In accordance with the prior art, complicated realignment steps were required in order to remove this oxide only from the mesa regions.

The diode arrays which are normally formed are square matrices of diodes with linear densities of as high as 2000 diodes per linear inch. These arrays have been formed in the prior art by several methods. One such method is the application of photoresist to the semiconductor slice with subsequent exposure to light through a photo-mask which has been aligned with the mesas. This method is time consuming and requires very precise mask fabrication, especially with densities as high as 2000 diodes per linear inch. In addition, the accuracy of the alignment will vary from slice to slice.

Another prior art method is the use of nitride as the original etch mask for the mesas. This nitride is left on the slices during the thermal oxidation and is then removed. There are several drawbacks to this prior art method. Growing a uniform nitride is difficult. Also, the patterning and etching of the nitride is more difficult than it is with oxides which are used with the process used in accordance with the invention herein. Likewise, more process steps are required with the nitride than is required in accordance with the invention herein.

In accordance with the present invention, alignment problems found in the prior art as described above are overcome and there is provided a method of removing oxide only from the mesas on a silicon slice which is simple and does not require difficult alignment steps as in the prior art. Briefly, the above is accomplished by providing a semiconductor slice having mesa regions thereon in a predetermined pattern and then forming an oxide layer over the entire slice including the mesas and the valleys therebetween. A photoresist is then deposited on the surface of the slice, the photoresist depositing in the valleys to a greater depth than in the region over the mesas. With proper exposure to light, the photoresist over the mesas will become completely exposed whereas the light will only penetrate part way in the region of the valleys. Thereby, the photoresist is removed completely from the tops of the mesas and only partially in the valleys leaving a layer of photoresist in the entire valley regions. The oxide in the mesa regions is then removed by normal etching techniques to expose the semiconductor material and then subsequent diffusion steps are provided to form diodes in the mesa regions.

It is therefore an object of this invention to provide a method of forming diode arrays in semiconductor slices which do not require complex alignment steps.

It is a further object of this invention to provide a method for formation of diode arrays in semiconductor slices having mesa regions formed therein which does not require masking steps for removal of oxide from the mesa regions.

It is a yet further object of this invention to provide a method for removing oxide from the mesa regions of a semiconductor slice having oxide on the mesa regions and valleys therebetween by depositing a photoresist in the valleys at a greater thickness to the photoresist deposited on the mesas and then exposing the photoresist completely on the mesas and only partially in the valleys to permit complete removal of photoresist only from the mesas.

The above objects and still further objects of the invention will immediately become apparent to those skilled in the art after consideration of the following preferred embodiment thereof, which is provided by way of example and not by way of limitation, wherein.

Figure 1:
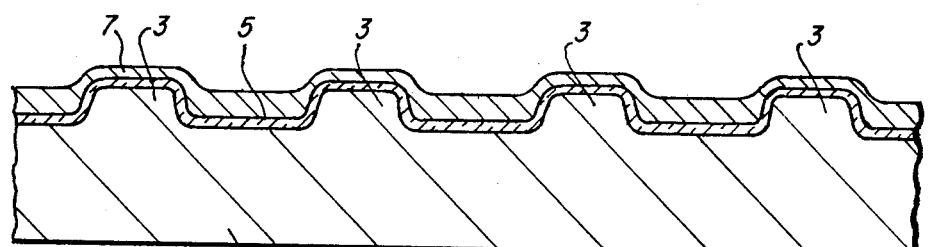
FIG. 1 is a cross-sectional view of a semiconductor slice having mesa regions thereon and an oxide layer over the entire semiconductor surface with the photoresist material deposited over the oxide layer in accordance with the present invention.

Referring now to FIG. 1, there is shown a semiconductor slice 1, which can be silicon, having a plurality of mesa regions 3 therein. The mesa regions 3 can be formed in any configuration and are preferably formed in accordance with a rectangular matrix array. An oxide layer 5 is formed on the upper surface of the slice 1 to cover the mesas 3 and the valleys between the mesas. The oxide layer can be grown in accordance with any of the well known techniques of the prior art. In the formation of P-N junction diodes in the mesa regions, it is now necessary to remove the oxide layer 5 only in the region over the mesas and retain the oxide in the valleys between the mesas for isolation. This is accomplished by depositing a photoresist layer 7 over the oxide layer, the photoresist forming a thicker layer in the valleys than over the mesas. The ratio of the thickness of the photoresist in the valleys to that of the mesas is a function of the viscosity of the photoresist, this ratio of photoresist thickness in the valleys to photoresist thickness on the mesas being greater as the viscosity of the photoresist increases. It can be seen in FIG. 1 that the photoresist layer 7 is thicker in the valleys than it is over the mesas and it is necessary that this difference exist for operation in accordance with the present invention.

Figure 2:
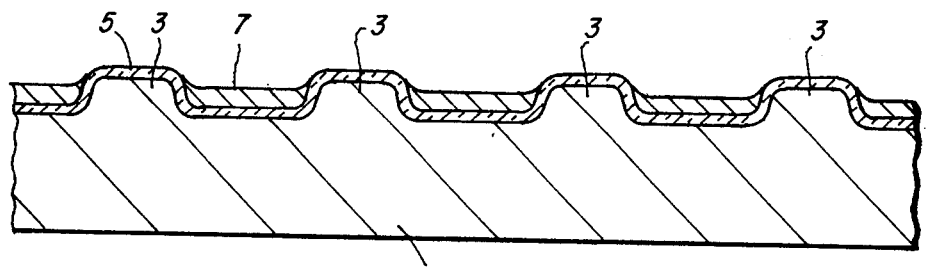
FIG. 2 is a cross-sectional view of the semiconductor slice of FIG. 1 after some of the photoresist has been removed from the valleys and all of the photoresist has been removed from the mesas.
Figure 3:
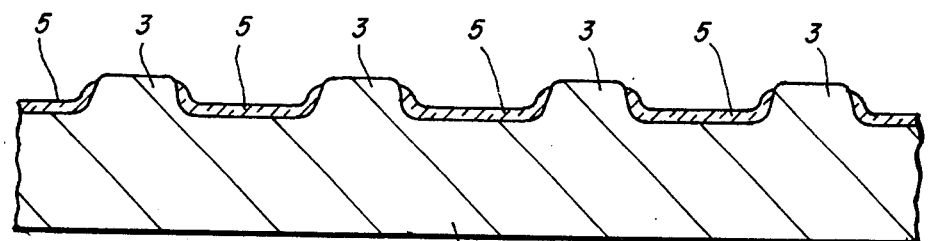
FIG. 3 is a cross-sectional view of the semiconductor slice of FIG. 2 after removal of the oxide from the mesas and the photoresist from the valleys.

The photoresist material is now exposed to light, the amount of light and length of exposure being a function of the ratio of thickness of the photoresist layer over the mesas to the photoresist layer in the valleys. The exposure is sufficient to completely expose the photoresist layer 7 over the mesas and only expose the photoresist layer in the valleys for a small portion therethrough so that, after exposure, all of the photoresist can be removed from the mesa regions and only part of the photoresist is removed from the valleys during the photoresist removal step as shown in FIG. 2. The slice as shown in FIG. 2 is now prepared for etching in accordance with standard techniques to remove the oxide layer from the mesa regions. After this oxide has been removed, the semiconductor material in the mesa regions is exposed as shown in FIG. 3 and the slice is now prepared for the necessary diffusion steps.

Figure 4:
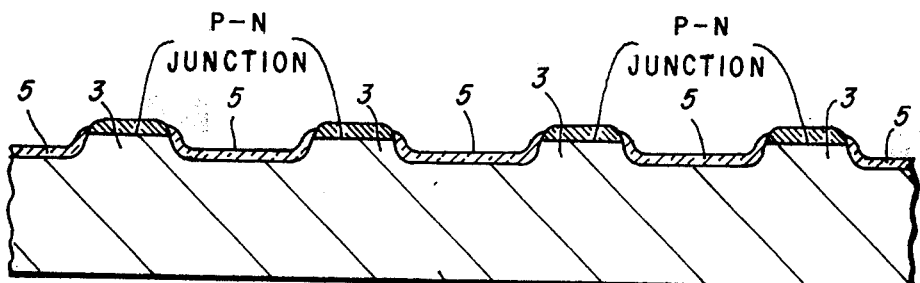
FIG. 4 is a cross-sectional view of the slice of FIG. 3 after the formation of P-N junctions in the mesa regions to form a diode array.

As shown in FIG. 4, a P-N junction has been formed in the mesa regions by standard diffusion techniques to provide the completed diode array. It can be seen that the oxide has been removed without the requirement of masking and other complex alignment techniques which have been required in accordance with the prior art. It should be understood that, while the preferred embodiment has been provided with reference to mesa structures in which diodes are formed, it is available in other multi-level integrated circuits where a layer must be removed from the highest point on the structure. The invention therefore has wider application than only in the formation of diode arrays.

It can be seen that the alignment required in accordance with the present invention comes from the structure itself and it is this structure which eliminates the necessity for accurate photo-mask alignment as well as the use of photomasks and the labor thereby involved.

In a specific example of operation in accordance with the present invention, the photoresist used in FIG. 1 was AZ 111(Shipley) which was applied as shown and allowed to set on the wafer for about 30 seconds to allow proper wetting action. The wafer was then spun at 6,000 RPM for from 25 to 30 seconds. This resulted in an approximately 4:1 valley resist thickness to mesa top resist thickness. As a result, the required exposure time for completely exposing the photoresist on the mesas was only one-fourth that required to totally expose the photoresist in the valleys. The exposure time is on the order of several seconds and the resist is developed off the mesa tops. Approximately three-fourths of the original valley resist thickness is left to mesh the valleys and mesa walls.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:
1. A method for the fabrication of a p-n junction diode array which comprises the steps of:
 a. forming an array of mesa regions on a semiconductor silicon slice;
 b. forming an oxide layer on the surface of said semiconductor slice to cover the mesa regions and the semiconductor surface between the mesas;
 c. coating said oxide layer with a positive photoresist to provide a resist thickness between mesas approximately four times as great as the thickness on the mesa tops;
 d. exposing the photoresist for a time sufficient to react the complete thickness on the mesa tops, which permits about three-fourths of the resist thickness between mesas to remain unreacted;
 e. developing the photoresist whereby the mesa tops are selectively exposed;
 f. selectively etching the exposed mesa tops to remove said oxide layer therefrom; and thereafter
 g. selectively diffusing an impurity of opposite conductivity type into the mesa regions thereby forming said diode array.

2. A method as set forth in claim 1 wherein said mesas are arranged in a rectangular matrix array.

* * * * *